United States Patent
Lum

(10) Patent No.: US 12,087,986 B2
(45) Date of Patent: Sep. 10, 2024

(54) GALVANIC ISOLATOR

(71) Applicant: MPICS INNOVATIONS PTE. LTD, Singapore (SG)

(72) Inventor: Kok Keong Richard Lum, Singapore (SG)

(73) Assignee: MPICS INNOVATIONS PTE. LTD, Singapore (SG)

( * ) Notice: Subject to any disclaimer, the term of this patent is extended or adjusted under 35 U.S.C. 154(b) by 130 days.

(21) Appl. No.: 17/585,212

(22) Filed: Jan. 26, 2022

(65) Prior Publication Data

US 2022/0238977 A1    Jul. 28, 2022

Related U.S. Application Data

(60) Provisional application No. 63/142,061, filed on Jan. 27, 2021.

(51) Int. Cl.
*H03K 5/1252* (2006.01)
*H01P 1/36* (2006.01)

(52) U.S. Cl.
CPC ............. *H01P 1/36* (2013.01); *H03K 5/1252* (2013.01)

(58) Field of Classification Search
CPC .................................................. H03K 5/1252
See application file for complete search history.

(56) References Cited

U.S. PATENT DOCUMENTS

| | | | |
|---|---|---|---|
| 2010/0111218 A1* | 5/2010 | Chen, Jr. | H04L 25/0292 375/285 |
| 2011/0309475 A1* | 12/2011 | Lee | G11C 7/1048 257/E29.345 |
| 2021/0218382 A1* | 7/2021 | Hickle | H03H 7/0153 |
| 2022/0238977 A1* | 7/2022 | Lum | H01P 1/2007 |

* cited by examiner

*Primary Examiner* — Sibin Chen
(74) *Attorney, Agent, or Firm* — Sheridan Ross P.C.

(57) ABSTRACT

An isolator, circuit, and isolation method are disclosed. An illustrative capacitive isolator is disclosed to include an input side that receives an electrical input signal, an output side that outputs an electrical output signal, and an isolation barrier that electrically isolates the input side from the output side. The input side is further disclosed to include an array of input capacitors, where each capacitor in the array of input capacitors receives an input pulse based on the electrical input signal, where each capacitor in the array of input capacitors receives the input pulse offset from input pulses received at others of the capacitors in the array of input capacitors thereby extending a pulse duration of the electrical input signal.

15 Claims, 11 Drawing Sheets

GALVANIC ISOLATOR

CROSS REFERENCE TO RELATED APPLICATION

The present application claims the benefit under 35 U.S.C. § 119(e) of U.S. Provisional Application Ser. No. 63/142,061, filed Jan. 27, 2021, entitled "GALVANIC ISOLATOR", which is hereby incorporated herein by reference in its entirety.

BACKGROUND

The present disclosure is generally directed toward electronic isolation and devices for accommodating the same.

Electronic isolation systems are electronic devices driven by different power domains and, thus, unsuitable to be electrically connected. However, the electronic devices operated in different power domains must communicate to function as a control system. For this purpose, galvanic isolators may be used. Galvanic isolators are devices that allow exchanges of signals without any direct electrical connections. Optocouplers and capacitive isolators are commonly used isolators. Optocouplers convert electrical signals into light signals to transmit across an isolation material. In contrast, capacitive couplers transmit electrical signals from a first circuit to a second circuit that is electrically isolated through electric fields.

BRIEF SUMMARY

Example aspects of the present disclosure include:

A capacitive isolator, comprising: an input side that receives an electrical input signal, wherein the input side comprises an array of input capacitors, wherein each capacitor in the array of input capacitors receives an input pulse based on the electrical input signal, and wherein each capacitor in the array of input capacitors receives the input pulse offset from input pulses received at others of the capacitors in the array of input capacitors thereby extending a pulse duration of the electrical input signal; an output side that outputs an electrical output signal, wherein the electrical output signal is indicative of the electrical input signal; and an isolation barrier that electrically isolates the input side from the output side.

Any of the aspects herein, wherein the array of input capacitors comprises a first capacitor and a second capacitor connected in parallel with one another.

Any of the aspects herein, wherein the first capacitor receives a first input pulse and wherein the second capacitor receives a second input pulse.

Any of the aspects herein, wherein the second capacitor receives the second input pulse an amount of time after the first capacitor receives the first input pulse.

Any of the aspects herein, wherein the amount of time is substantially equal to a rise time of a pulse applied to a galvanic isolation capacitor.

Any of the aspects herein, wherein the galvanic isolation capacitor is connected to the array of input capacitors at a floating node.

Any of the aspects herein, wherein the pulse duration of the electrical input signal is substantially equivalent to a total sum of delay applied to between each of the input pulses.

Any of the aspects herein, wherein the array of input capacitors comprises a third capacitor connected in parallel with the first capacitor and the second capacitor.

Any of the aspects herein, wherein the third capacitor receives a third input pulse the amount of time after the second capacitor receives the second input pulse.

A method of transmitting a signal across a galvanic isolation barrier with a capacitor isolator, the method comprising: receiving an electrical input signal at an input side of the capacitor isolator; providing, as a result of receiving the electrical input signal, a first input pulse to a first capacitor in an array of input capacitors; providing, as a result of receiving the electrical input signal, a second input pulse to a second capacitor in the array of input capacitors, wherein the first capacitor and second capacitor are connected in parallel, and wherein the second input pulse is provided to the second capacitor with a delay as compared to when the first input pulse is provided to the first capacitor; receiving outputs from the first capacitor and second capacitor at a galvanic isolation capacitor, wherein the outputs are received in response to the first capacitor and second capacitor receiving the first input pulse and second input pulse, respectively; and transmitting an electrical output signal at an output side of the capacitor isolator, wherein the electrical output signal is generated based on the outputs received at the galvanic isolation capacitor from the first capacitor and the second capacitor.

Any of the aspects herein, wherein the electrical output signal is indicative of the electrical input signal.

Any of the aspects herein, wherein the galvanic isolation capacitor establishes the galvanic isolation barrier.

Any of the aspects herein, wherein the galvanic isolation capacitor is connected to the first capacitor and the second capacitor at a floating node.

Any of the aspects herein, wherein the delay substantially corresponds to a rise time of a pulse applied to the galvanic isolation capacitor.

Any of the aspects herein, further comprising: providing, as a result of receiving the electrical input signal, a third input pulse to a third capacitor in the array of input capacitors, wherein the third capacitor is connected in parallel with the first capacitor and the second capacitor, and wherein the third input pulse is provided to the third capacitor with the delay as compared to when the second input pulse is provided to the second capacitor.

Any of the aspects herein, further comprising: driving at least one of the first capacitor and the second capacitor with a buffer.

Any of the aspects herein, wherein the buffer comprises a CMOS buffer.

Any of the aspects herein, wherein the first capacitor is driven by a first buffer and the second capacitor is driven by a second buffer and wherein the first buffer and the second buffer are provided in a follower configuration.

Any of the aspects herein, wherein a diode is connected to an input of the first capacitor.

An isolation system, comprising: an input circuit; an output circuit; and an isolation barrier that electrically isolates the input circuit from the output circuit, wherein the input circuit comprises an array of input capacitors, wherein each capacitor in the array of input capacitors receives an input pulse based on an electrical input signal received at the input circuit, and wherein each capacitor in the array of input capacitors receives the input pulse offset from input pulses received at others of the capacitors in the array of input capacitors thereby extending a pulse duration of the electrical input signal.

Any of the aspects herein, wherein the array of input capacitors comprises three or more input capacitors.

Any aspect in combination with any one or more other aspects.

Any one or more of the features disclosed herein.

Any one or more of the features as substantially disclosed herein.

Any one or more of the features as substantially disclosed herein in combination with any one or more other features as substantially disclosed herein.

Any one of the aspects/features/embodiments in combination with any one or more other aspects/features/embodiments.

Use of any one or more of the aspects or features as disclosed herein.

It is to be appreciated that any feature described herein can be claimed in combination with any other feature(s) as described herein, regardless of whether the features come from the same described embodiment.

The details of one or more aspects of the disclosure are set forth in the accompanying drawings and the description below. Other features, objects, and advantages of the techniques described in this disclosure will be apparent from the description and drawings, and from the claims.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together. When each one of A, B, and C in the above expressions refers to an element, such as X, Y, and Z, or class of elements, such as X1-Xn, Y1-Ym, and Z1-Zo, the phrase is intended to refer to a single element selected from X, Y, and Z, a combination of elements selected from the same class (e.g., X1 and X2) as well as a combination of elements selected from two or more classes (e.g., Y1 and Zo).

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

The preceding is a simplified summary of the disclosure to provide an understanding of some aspects of the disclosure. This summary is neither an extensive nor exhaustive overview of the disclosure and its various aspects, embodiments, and configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and configurations of the disclosure are possible utilizing, alone or in combination, one or more of the features set forth above or described in detail below.

Numerous additional features and advantages are described herein and will be apparent to those skilled in the art upon consideration of the following Detailed Description and in view of the figures.

BRIEF DESCRIPTION OF THE DRAWINGS

Illustrative embodiments by way of examples, not by way of limitation, are illustrated in the drawings. Throughout the description and drawings, similar reference numbers may be used to identify similar elements. The drawings may be simplified illustrative views rather than precise engineering drawings. The drawings are for illustrative purposes to assist understanding and may not necessarily be drawn per actual scale.

DETAILED DESCRIPTION

The following description is not intended to limit the scope, applicability, or configuration of the claims. Instead, the description is written to provide those skilled in the art with an enabling description for implementing the described embodiments. It is understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements illustrated. It is understood that when an element such as a region, structure, substrate, or the like, is referred to as being "on" another element, it can be directly on the other element or intervening elements may also be present. In contrast, when an element is referred to as being "directly on" another element, there are no intervening elements present. Similarly, the term "connected to" can be interpreted as "connected directly to" or "being connected to with intervening elements." As used herein, the singular forms "a," "an," and "the" are intended to include the plural forms as well, unless the context indicates otherwise.

In some examples, as described herein, capacitive galvanic isolators may use a matched pair of high-voltage capacitors to transmit electrical signals across a galvanic isolation barrier. These types of isolators may be capable of sending a fully differential signal across the pair of capacitors.

Figure 1:
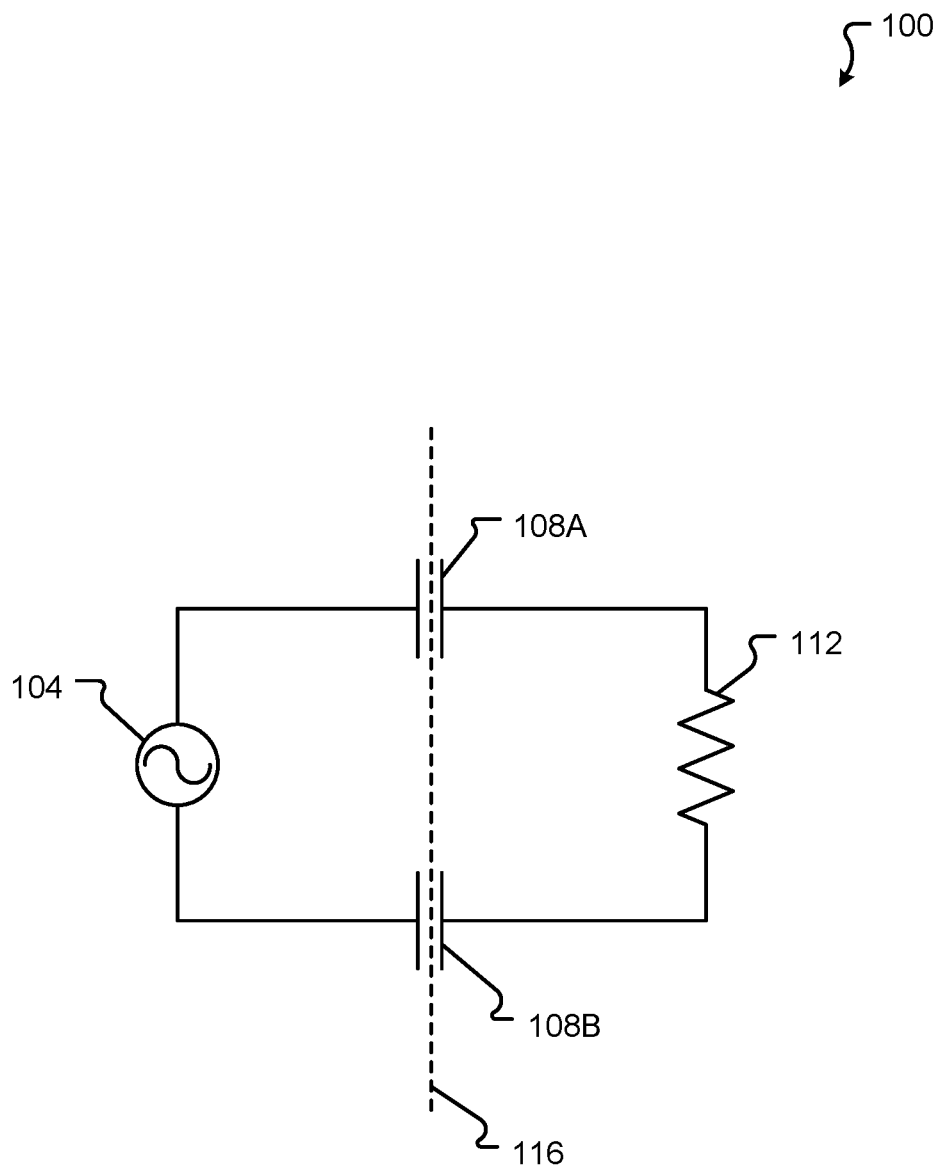
FIG. 1 shows an illustrative block diagram of a device or an isolation system.

FIG. 1 shows an illustrative block diagram 100 of a device or an isolation system in accordance with examples as described herein. In some examples, the block diagram 100 may be used for a capacitive galvanic isolation signal transmission. For example, the block diagram 100 may illustrate how a signal transmission and reception is achieved in galvanically isolated capacitive couplers.

In some examples, capacitive galvanic isolators use a matched pair of high voltage capacitors to transmit signals across a galvanic isolation barrier. The capacitive galvanic isolators may transmit signals across a galvanic isolation barrier by sending a fully differential signal across the pair of capacitors. For example, as shown, the block diagram 100 may include a transmitter signal source 104, a first capacitor 108A, a second capacitor 108B, and a receiver load and detector 112 (e.g., resistive load). The first capacitor 108A and the second capacitor 108B may form a galvanic isolation barrier 116. Accordingly, the transmitter signal source 104 may transmit signals across a galvanic isolation (e.g., the galvanic isolation barrier 116) using the matched pair of capacitors (e.g., the first capacitor 108A and the second capacitor 108B). The receiver load and detector 112 may receive these signals across the galvanic isolation.

As described herein, the portion of the block diagram 100 to the left of the galvanic isolation barrier 116 may be referred to as an input side of the device or the isolation system as described herein (e.g., based on the transmitter signal source 104 that inputs a signal into the isolation system being located on that side of the galvanic isolation barrier 116). Additionally or alternatively, the portion of the block diagram 100 to the right of the galvanic isolation barrier 116 may be referred to as an output side of the device or the isolation system as described herein (e.g., based on the receiver load and detector 112 that receives the signal across the galvanic isolation barrier 116 being located on that side of the galvanic isolation barrier 116). While described and shown in terms of "right" and "left," it is understood that the device or the isolation system as described herein may generally include an input side and an output side located on either side of a galvanic isolation barrier 116, where the galvanic isolation barrier 116 electrically isolates the input side from the output side.

Figure 2:
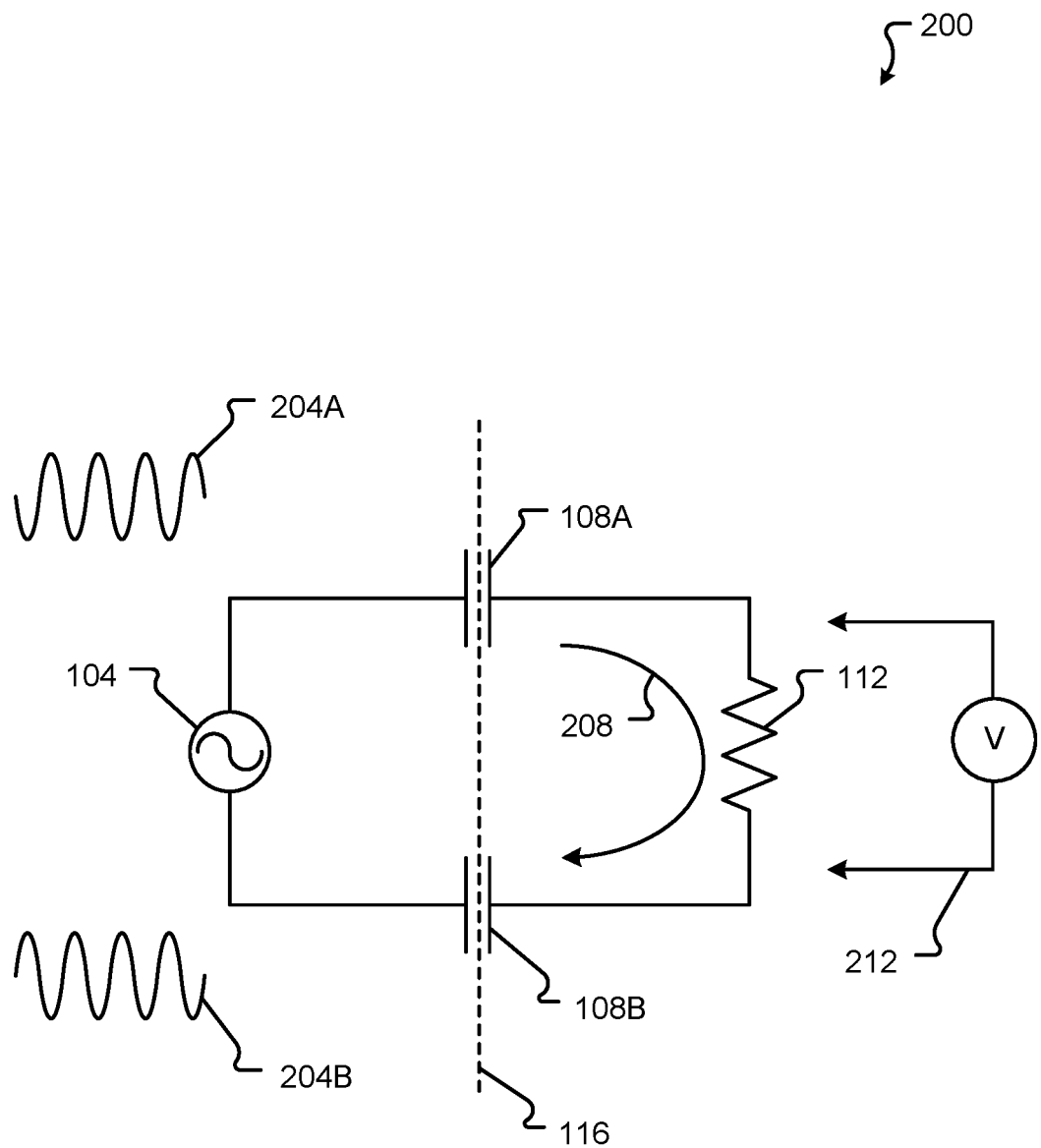
FIG. 2 shows an additional illustrative block diagram of a device or an isolation system.

FIG. 2 shows an additional illustrative block diagram 200 of a device or an isolation system in accordance with examples as described herein. In some examples, the block diagram 200 may implement aspects of the block diagram 100 described previously. For example, the block diagram 200 may include the transmitter signal source 104, the first capacitor 108A, the second capacitor 108B, the receiver load and detector 112, and the galvanic isolation barrier 116 as described previously and herein. Additionally, the block diagram 200 may illustrate a receiver detection of differential signals from an isolated transmitter side of the isolation system.

Differential signals 204 may be used to generate a loop current 208 around the two capacitors 108, and, in doing so, the signal current (e.g., the loop current 208) generated by the transmitter (e.g., the transmitter signal source 104) can be detected by a receiver 212 (e.g., voltmeter as shown in the example of FIG. 2) when applied to a load (e.g., the receiver load and detector 112). That is, a receiver signal voltage is generated at the receiver 212. This detected voltage can, therefore, be decoded and converted for use in the isolated side of a coupler (e.g., the isolation system).

In some examples, the signals 204 to be sent across the galvanic isolation barrier 116 may be fully differential in nature. For example, a first signal 204A sent by the transmitter signal source 104 may be fully differential in nature than a second signal 204B also sent by the transmitter signal source 104. Additionally, the pair of capacitors 108 may provide a return path (e.g., the loop current 208) for the differential signal current generated by the transmitter. Subsequently, a signal voltage may be generated at a receiver side (e.g., at the receiver load and detector 112 and measured by the receiver 212) and can be decoded.

Figure 3:
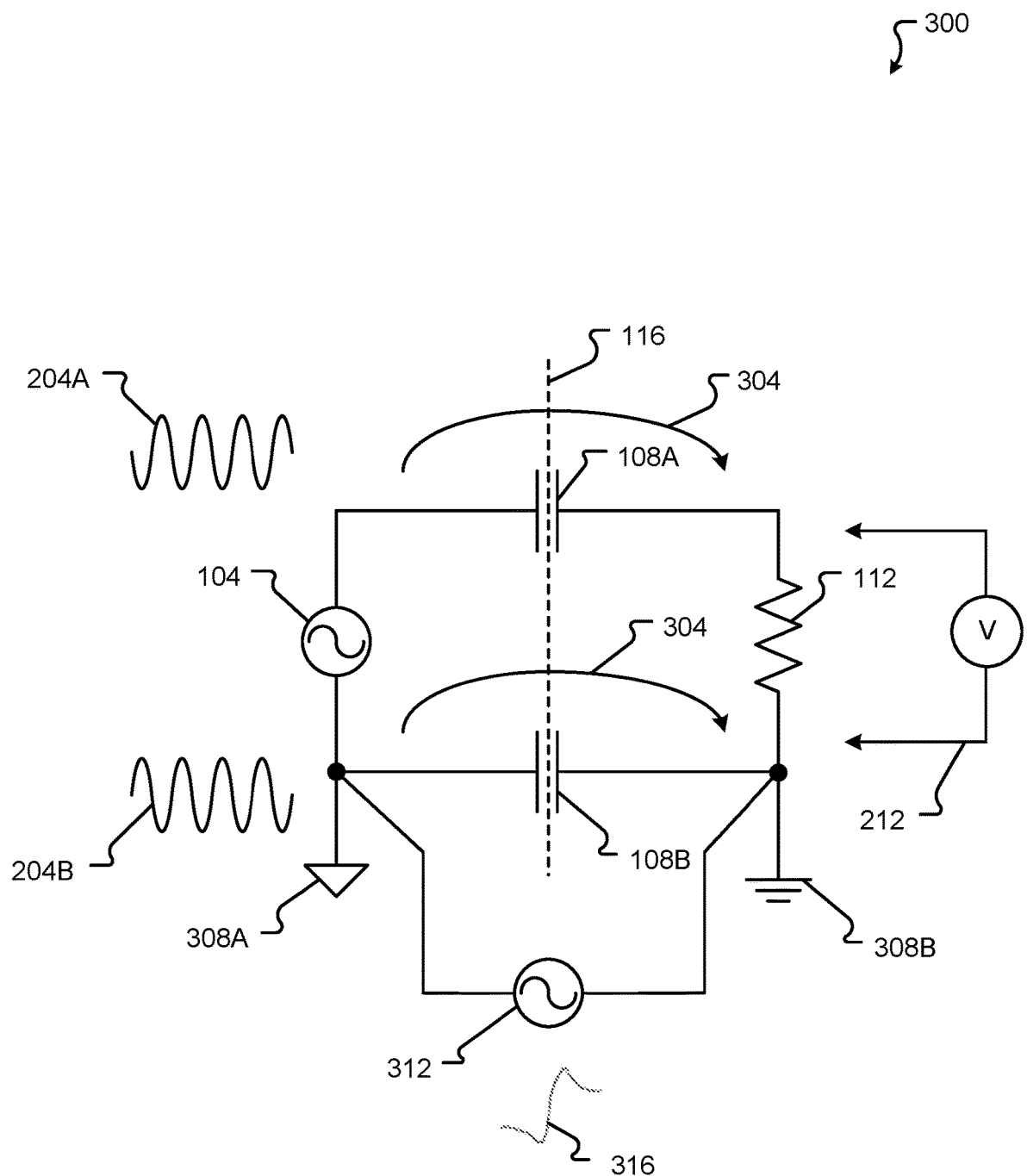
FIG. 3 shows an additional illustrative block diagram of a device or an isolation system.

FIG. 3 shows an additional illustrative block diagram 300 of a device or an isolation system in accordance with examples as described herein. In some examples, the block diagram 300 may implement aspects of the block diagram 100 and the block diagram 200 described previously. For example, the block diagram 300 may include the transmitter signal source 104, the first capacitor 108A, the second capacitor 108B, the receiver load and detector 112, the galvanic isolation barrier 116, the signals 204, and the receiver 212 as described previously and herein. Additionally, the block diagram 300 may illustrate a common mode current 304 in the matched pair of capacitors 108 due to common mode transient noise. The block diagram 300 may also include a first ground 308A (e.g., for the input side and/or the transmitter signal source 104) and a second ground 308B (e.g., for the output side and/or the receiver load and detector 112).

As the two grounds 308 of the receiver and transmitter are galvanically isolated (e.g., the two grounds 308 are on either side of the galvanic isolation barrier 116), a potential difference may exist between the first ground 308A (e.g., GND1) and the second ground 308B (e.g., GND2). This potential difference may allow a high voltage isolation using the dielectric breakdown capability of the two high-voltage capacitors 108.

In some examples, a transient signal change in potential may exist between the first ground 308A and the second ground 308B, and, therefore, a common mode current 304 going through the two capacitors 108 in the same direction may occur. In some examples, the common mode current 304 may occur due to a signal being provided between the galvanically isolated region. For example, as the two grounds 308 are isolated, a common mode signal 316 (e.g., provided by an additional transmitter signal source 312) can exist between these two grounds 308 leading to the common mode current 304 (in the same direction) going across the capacitors 108. This common mode current 304 may not have useful signal information and, therefore, may be classified as additional noise to the signal transference behaviour.

Figure 4:
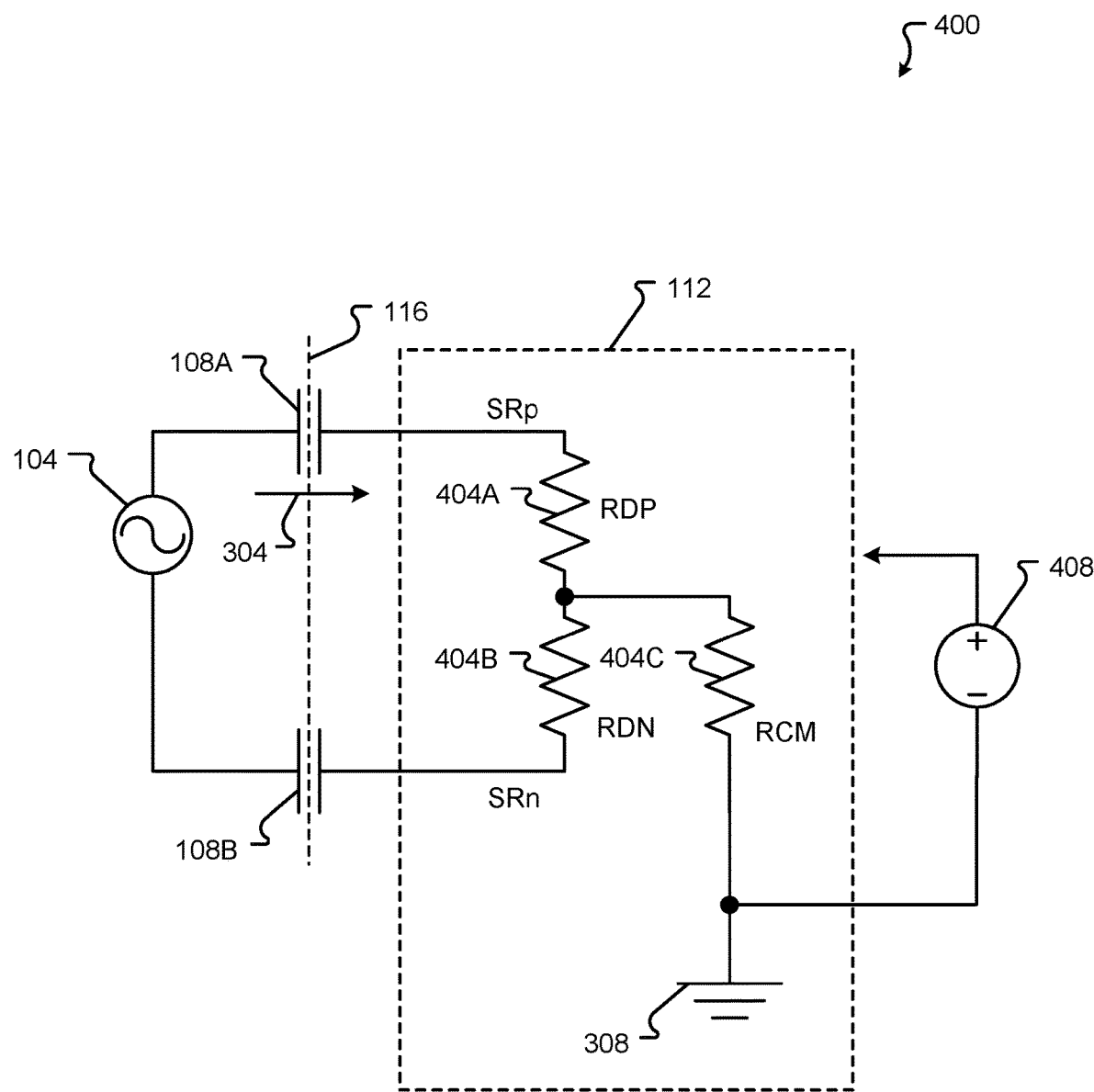
FIG. 4 shows an additional illustrative block diagram of a device or an isolation system.

FIG. 4 shows an additional illustrative block diagram 400 of a device or an isolation system in accordance with examples as described herein. In some examples, the block diagram 400 may implement aspects of the block diagram 100, the block diagram 200, and the block diagram 300 described previously. For example, the block diagram 400 may include the transmitter signal source 104, the first capacitor 108A, the second capacitor 108B, the receiver load and detector 112, the galvanic isolation barrier 116, the common mode current 304, and a ground 308 as described previously and herein. Additionally, the receiver load and detector 112 may include a first load 404A (e.g., RDP), a second load 404B (e.g., RDN), and a third load 404C (e.g., RCM). In some examples, the block diagram 400 may illustrate or include a transmitter and receiver with real integrated circuits.

In some examples, the common mode current 304 can adversely affect the operations of the receiver circuitry (e.g., circuitry and loads of the receiver load and detector 112), which may be limited by a power supply voltage 408 at the receiver end. For example, if the common mode current 304 is too high, it can cause the receiver to go outside of its acceptable input common mode range and, therefore, can cause disruption to the receiver signal chain leading to receiver error.

At the receiver side, a differential signal may be received or provided across the galvanic isolation barrier 116. For example, the differential signal may include a first signal provided across the first capacitor 108A (e.g., SRp) and a second signal provided across the second capacitor 108B (e.g., SRn), where the differential signal is determined based on the two signals (e.g., the differential signal is determined by SRp-SRn). In some examples, the differential signal may be amplified by a receiver amplifier before being decoded into useful (e.g., analog and/or digital) signals. Therefore, the node voltages of the first signal and the second signal (e.g., SRp and SRn) may be limited by a supply range and the input common mode range of the receiver amplifier.

In some examples, current in a capacitor (e.g., such as the common mode current 304) is given by Equation (1) as follows:

$$I_c = C dV/dt \qquad (1)$$

where C represents the capacitance of the capacitor, and dV/dt represents a rate of change of voltage potential across the terminals of the capacitor.

For a given dV/dt, the maximum current will cause the common voltage of the first signal and the second signal (e.g., SRp and SRn) to deviate depending on the direction of the current and such that the dV/dt (also called Slew Rate) does not impact the operations of the receiver amplifier. The maximum deviation may be related to (e.g., proportional to) the parallel combination of the first load 404A and the second load 404B (e.g., RDP//RDN) added to the third load 404C (e.g., +RCM). Therefore, the combination of the loads 404 (e.g., RDP//RDN+RCM) be kept as small as possible.

As the receiver current (e.g., current at the receiver load and detector 112) is proportional to C dV/dt, the receiver current can be increased by using larger capacitors (e.g., capacitors with higher capacitance). However, using larger capacitors may also increase the common mode current 304, which goes through the same capacitors 108.

Rather than using larger capacitors to increase the receiver current, the slew rate (e.g., dV/dt) of the transmitted signal can be increased so that the current level of the receiver current can be increased. Accordingly, the transmitting signal may need to be of a high frequency content and may be limited by the maximum signal transmission speed and signal change in a particular integrated circuit process. Other ways to increase the received signal level for a finite transmitted signal may include using higher resistance in the conversion from current to voltages in the receiver side. However, as noted previously, this higher resistance may also result in the receiver being more susceptible to saturation due to the common mode current 304, where this trade off cannot be resolved by adjusting resistances.

As described herein, the device or the isolation system described may be used to overcome the above trade-off limitations by circuit design and may allow a receiver structure to have an easily detectable voltage for robust communications.

Figure 5:
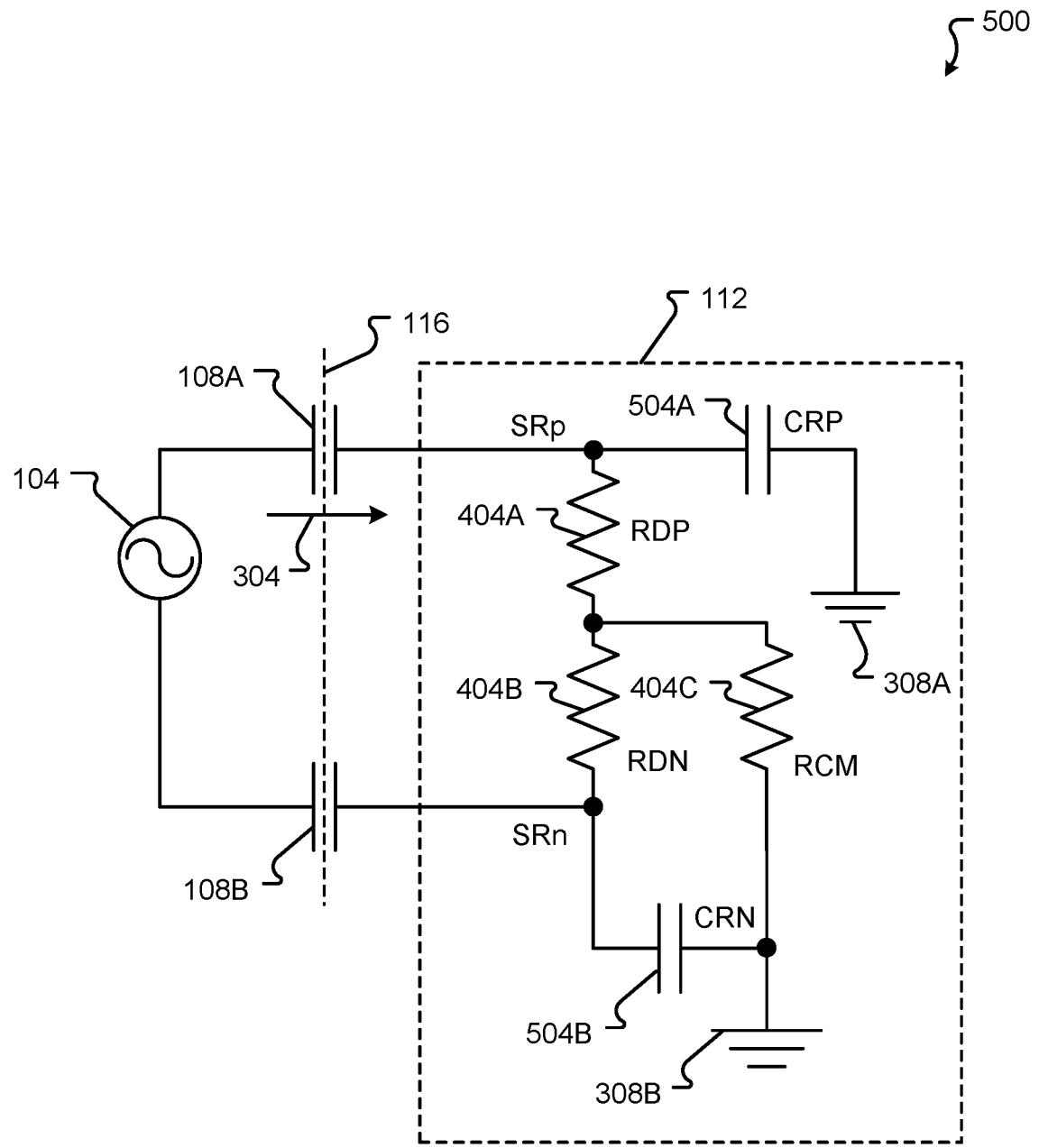
FIG. 5 shows a simplified model of a transmit/receive network.

FIG. 5 shows a simplified model 500 of a transmit/receive network (e.g., for a device or an isolation system) in accordance with examples as described herein. In some examples, the simplified model 500 may implement aspects of the block diagram 100, the block diagram 200, the block diagram 300, and the block diagram 400 described previously. For example, the simplified model 500 may include the transmitter signal source 104, the first capacitor 108A, the second capacitor 108B, the receiver load and detector 112, the galvanic isolation barrier 116, the common mode current 304, a first ground 308A, a second ground 308B, the first load 404A (e.g., RDP), the second load 404B (e.g., RDN), and the third load 404C (e.g., RCM) as described previously and herein. Additionally, the simplified model 500 may include a first capacitive load 504A (e.g., CRP) and a second capacitive load 504B (e.g., CRN).

The simplified model 500 may illustrate or represent a capacitive coupler as described herein. CRP and CRN (e.g., the first capacitive load 504A and the second capacitive load 504B, respectively) may represent the capacitive load(s) from the receiver amplifier, and this capacitance may load the galvanic coupling capacitors (e.g., the capacitors 108) and may cause a signal to be attenuated by the coupling capacitance ratio between the coupling capacitors and these loading capacitors. These capacitive loads 504 may also reduce rise and fall times of the signal generated by the displacement current as a result of signal transition in the transmitter.

In some examples, increasing the value of RDP and RDN (e.g., the first load 404A and the second load 404B) may result in a higher value of the signal generated at SRp and SRp, and this signal can be used for detection with the receiver amplifier. In order to have high rejection of common mode signals that can corrupt the differential signal, it is important to set the detection level as high as possible.

Figure 6:
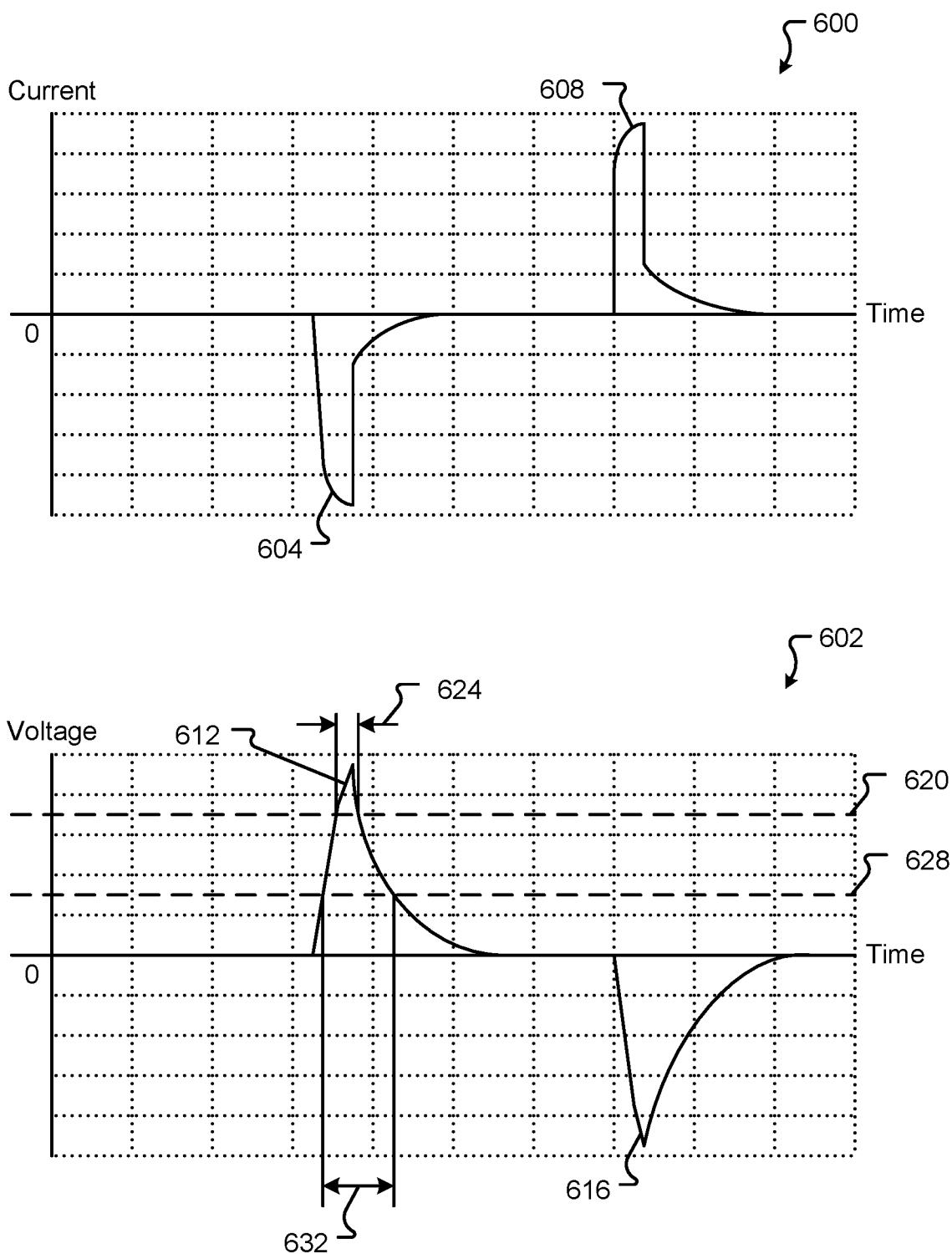
FIG. 6 shows example graphs of signal measurements.

FIG. 6 shows an example graph 600 and an example graph 602 of signal measurements in accordance with examples as described herein. The graph 600 may illustrate or represent power measurements corresponding to an injected current (e.g., from a transmitter or transmitter signal source, such as the transmitter signal source 104 as described previously with reference to FIGS. 1-5) to a device or isolation system as described herein. The graph 602 may illustrate or represent a voltage pulse generated at a receiver (e.g., the receiver load and detector 112 as described previously with reference to FIGS. 1-5) of a device or isolation system as described herein. For example, the voltage pulse generated at the receiver may correspond to a voltage generated based on the injected current and a load of the receiver (e.g., RDP and RDN or the first load 404A and the second load 404B as described with reference to FIG. 5).

As shown in the example of the graph 600, the injected current to the device or isolation system may include an injected current rise edge 604 and an injected current fall edge 608. Additionally, as shown in the example of the graph 602, the injected current to the device or isolation system may include a rise edge 612 for the received voltage pulse that corresponds to the injected current rise edge 604 and a fall edge 616 for the received voltage pulse that corresponds to the injected current fall edge 608.

However, due to the "RC" nature of the rise and fall of the received pulse (e.g., the rise edge 612 and the fall edge 616), the detected voltage pulse narrows as a detection threshold is increased. Based on the detected voltage pulse narrowing, a very high-speed detector may be needed to detect the voltage pulse, which can be limited by processing technology and power.

In some examples, a trade-off may exist between threshold settings and detectable pulse widths. For example, as shown, a high threshold 620 may be set for pulse detection. However, the high threshold 620 may result in a narrow pulse area 624 to be detected, which may require a high-speed receiver to perform the pulse detection. Additionally or alternatively, a low threshold 628 may be set for pulse detection, such that the low threshold 628 results in a larger pulse area 632 to be detected and a lower-speed receiver can be used for the pulse detection. However, the low threshold 628 may be susceptible to common mode noise.

In order to reject common mode noise for High Voltage Common Mode Rejection (HVCMR) specifications, it is desirable to set the threshold for pulse detection as high as possible. However, due to the pulse profile of the RC network, the detectable pulse will reduce in pulse width duration as the threshold increases, thus requiring a very high-speed detector. As the threshold is set lower, the pulse width duration gets wider to enable easier detection, but the noise margin-to-common mode noise may suffer as a result.

Figure 7:
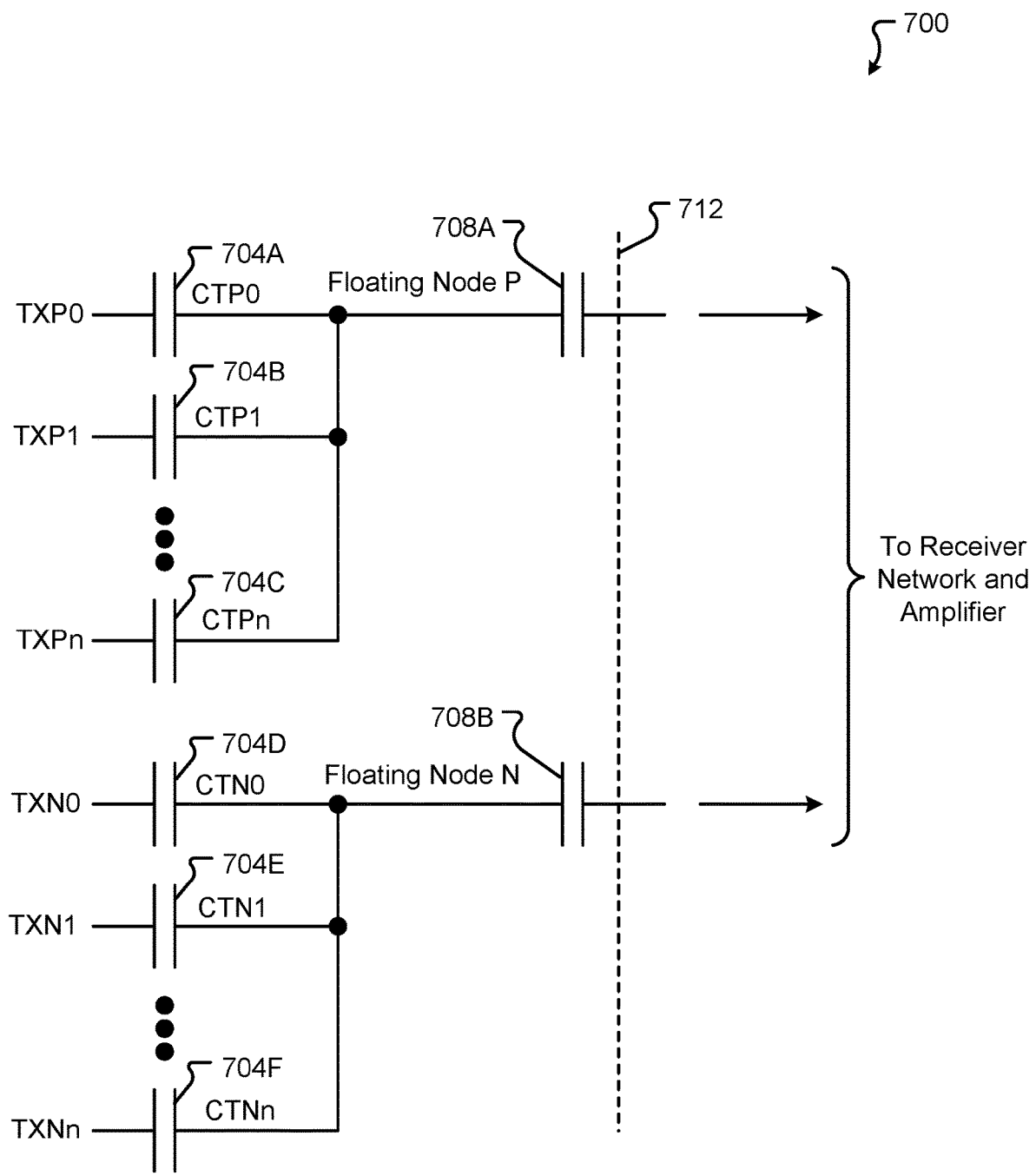
FIG. 7 shows an additional illustrative block diagram of a device or an isolation system.

FIG. 7 shows an additional illustrative block diagram 700 of a device or an isolation system in accordance with examples as described herein. In some examples, the block diagram 700 may illustrate or may be used as a structure of driving galvanically isolated capacitors. The block diagram 700 may illustrate a modifying of an input transmitting structure such that a voltage pulse duration is extended for easy detection and a threshold for pulse detection can be set as high as possible for good noise margin. For example, an array of coupling capacitors 704 (e.g., capacitors 704A, 704B, 704C, 704D, 704E, and 704F) may be used in series with galvanically coupled capacitors 708A and 708B (e.g., that form a galvanic isolation barrier 712, such as the galvanic isolation barrier 116 as described with reference to FIGS. 1-5).

Pulses may be applied by transmitter signal sources (e.g., TXP0, TXP1, TXPn, and TXN0, TXN1, TXNn) to these capacitors 704 (e.g., CTP0, CTP1, CTPn, and CTN0, CTN1, CTNn) with some delay from one pulse to another. As the rise time of each pulse generates a current pulse to be applied to a receiver load resistor, delaying each edge may result in a superposition of the resultant voltage pulse at the receiver. If the delay of each pulse is identical to the rise time of the pulse to the galvanic isolation capacitors, the superposition of the resultant voltages may be ideal, and the pulse may effectively get stretched by a delay equivalent to the total sum of delay of these transmitter pulses.

The block diagram 700 may include an input side (e.g., to the left of the galvanic isolation barrier 712) that receives an electrical input signal (e.g., the transmitter signal sources), where the input side includes the array of input capacitors 704. In some examples, each capacitor in the array of input capacitors 704 may receive an input pulse based on the electrical input signal, where each capacitor in the array of input capacitors 704 receives the input pulse offset from input pulses received at others of the capacitors in the array of input capacitors 704, thereby extending a pulse duration of the electrical input signal. In some examples, the pulse duration of the electrical input signal may be substantially equivalent to a total sum of delay applied to between each of multiple input pulses. Additionally, the block diagram 700 may include an output side (e.g., to the right of the galvanic isolation barrier 712) that outputs an electrical output signal, where the electrical output signal is indicative of the electrical input signal. Additionally, the galvanic isolation barrier 712 may electrically isolate the input side from the output side.

In some examples, the array of input capacitors 704 may include at least a first capacitor 704A and a second capacitor 704B that are connected in parallel with one another. Additionally, the first capacitor 704A may receive a first input pulse, and the second capacitor 704B may receive a second input pulse. In some examples, the second capacitor 704B may receive the second input pulse an amount of time after the first capacitor receives the first input pulse. For example, the amount of time between the second capacitor 704B receiving the second input pulse after the first capacitor 704A receives the first input pulse may be substantially equal to a rise time of a pulse applied to a galvanic isolation capacitor (e.g., one of the capacitors 708A and 708B). In some examples, the galvanic isolation capacitor may be connected to the array of input capacitors 704 at a floating node (e.g., floating node P).

In some examples, the array of input capacitors 704 may include a third capacitor 704C that is connected in parallel with the first capacitor 704A and the second capacitor 704B. Subsequently, the third capacitor 704C may receive a third input pulse the amount of time after the second capacitor 704B receives the second input pulse. That is the array of input capacitors 704 may include three or more input capacitors.

If the rise time is faster or slower than the delay timing of each pulses, ripples may form at the peak region of the pulse. As long as this delay difference is not too large, a suitable threshold can be set to detect the wider pulse duration resulting in simpler receiver architecture in terms of speed requirements, power dissipation, and noise margin.

Figure 8:
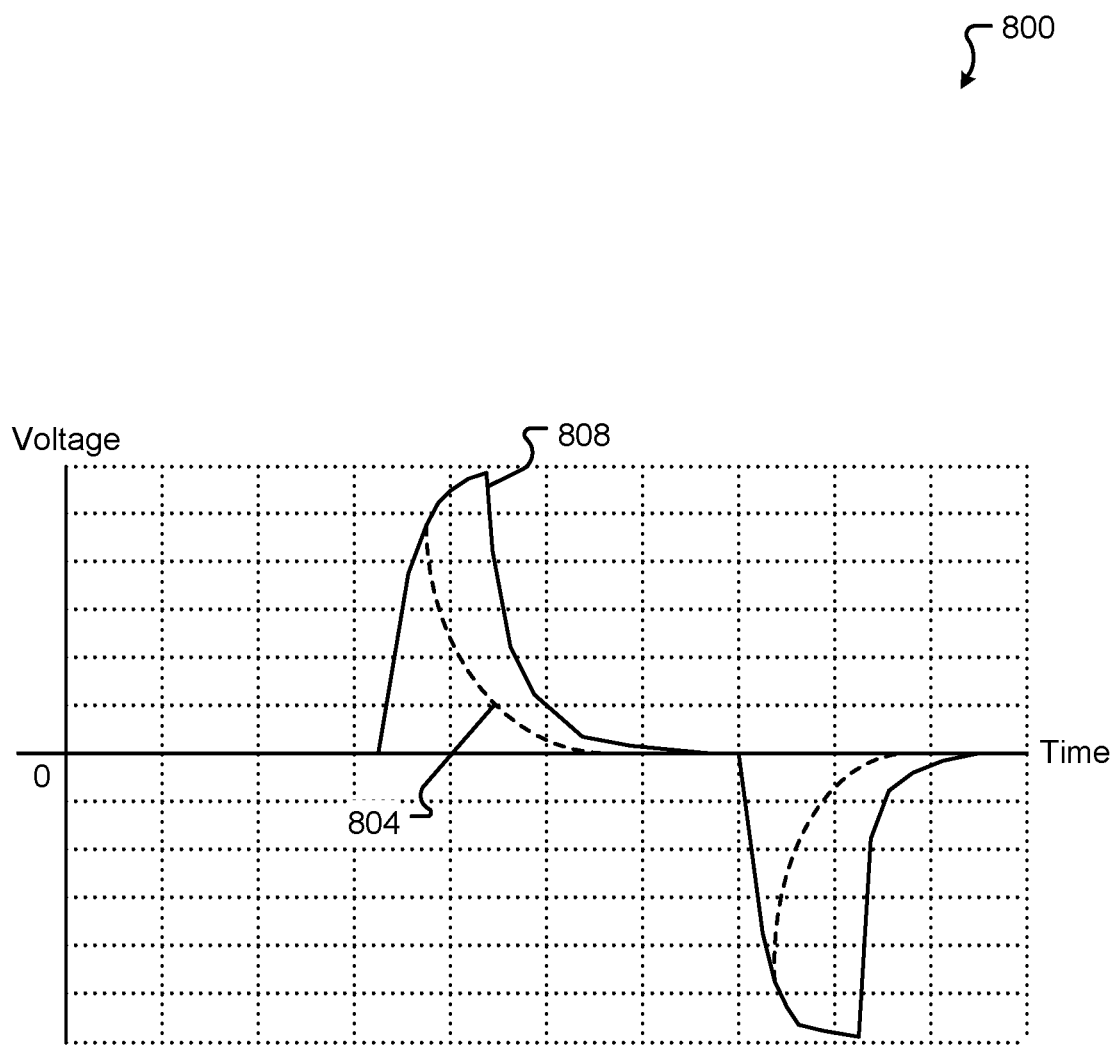
FIG. 8 shows an example graph of a signal measurement.

FIG. 8 shows an example graph 800 of a signal measurement in accordance with examples as described herein. For example, the graph 800 may represent a voltage pulse that can be detected and measured using the block diagram 700 as described with reference to FIG. 7. The graph 800 may include a first voltage pulse 804 that is generated with a single pulse and a second voltage pulse 808 that is generated with three pulses that are superposed to create a wider pulse duration. As shown, pulse width may be effectively stretched by using more pulses (e.g., injecting a current multiple times with a delay between each injection) to enable easier detection of the voltage pulse.

In the example of FIG. 8, the second voltage pulse 808 may represent scenarios where a pulse delay is equal to a pulse rise time. However, if the pulse delay is different than the pulse rise time, different pulse shapes/widths may be generated for the second voltage pulse 808 (e.g., a pulse that uses more than a single pulse). For example, if the pulse delay is less than the pulse rise time, a different voltage pulse may be generated, and if the pulse delay is greater than the pulse rise time, another different voltage pulse may be generated.

Figure 9:
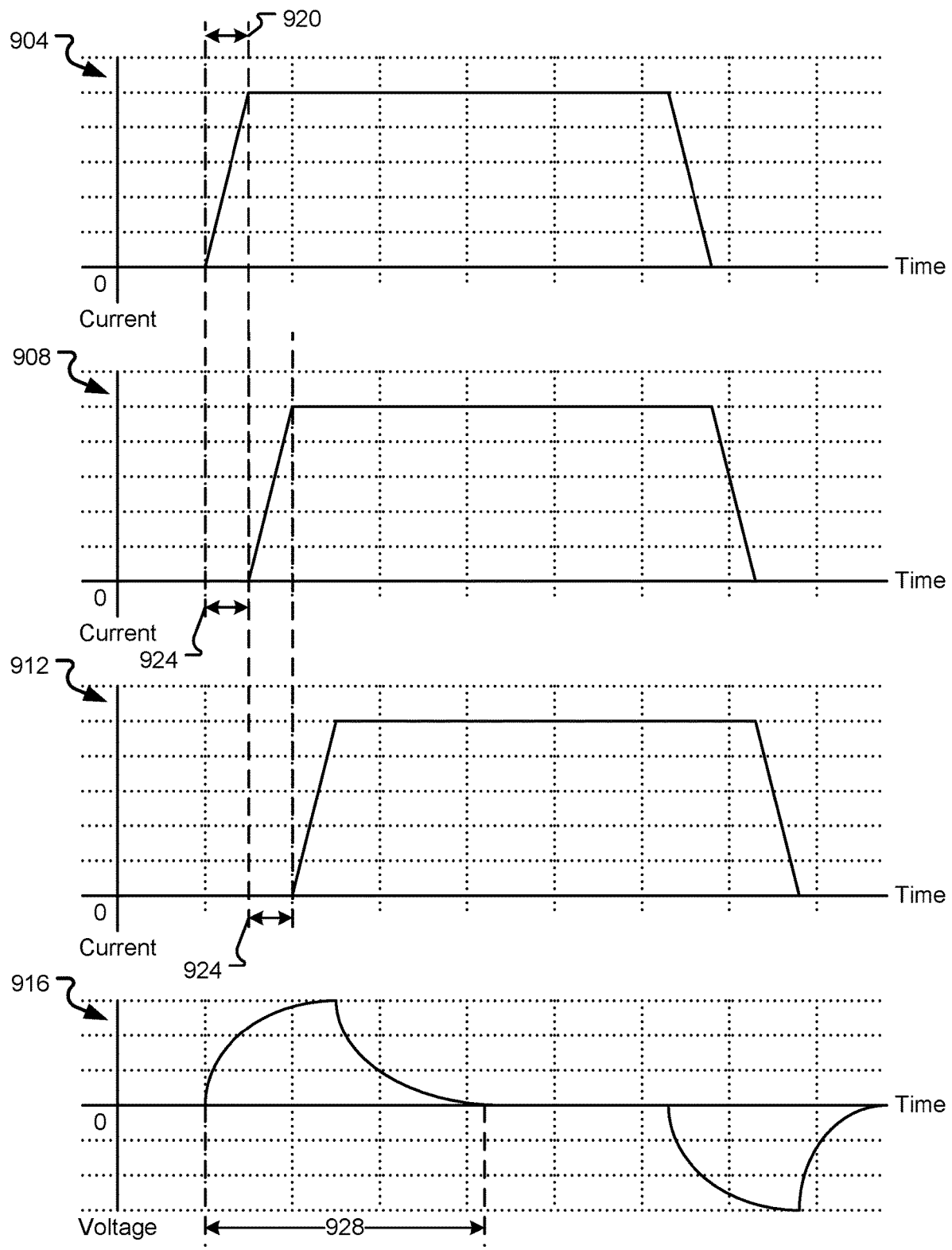
FIG. 9 shows example graphs of signal measurements.

FIG. 9 shows a set of example graphs 900 of signal measurements in accordance with examples as described herein. The set of graphs 900 may include a first graph 904, a second graph 908, a third graph 912, and a fourth graph 916. In some examples, the set of graphs 900 may represent multiple pulses transmitted across an array of capacitors (e.g., the first graph 904, the second graph 908, and the third graph 912) and a corresponding voltage pulse generated from the multiple pulses (e.g., the fourth graph 916) on a receiver side of a device or isolation system as described herein.

For example, the first graph 904 may represent a first pulse applied to a first capacitor of a capacitor array (e.g., by a first transmitter signal source), the second graph 908 may represent a second pulse applied to a second capacitor of the capacitor array (e.g., by a second transmitter signal source), and the third graph 912 may represent a third pulse applied to a third capacitor of the capacitor array (e.g., by a third transmitter signal source). The fourth graph 916 may represent a superposed resultant signal from the multiple pulses with pulse duration stretched for more efficient pulse detection.

In the example of FIG. 9, the different transmit pulses may be transmitted with a rise delay 920 equal to a delay 924 between the pulses. Additionally or alternatively, as described with reference to FIG. 8, the pulse delay (e.g., the delay 924) may be different than the rise time (e.g., the rise delay 920), which may result in different shapes of the superposed resultant signal from the multiple pulses and different pulse durations to be detected.

Figure 10A:
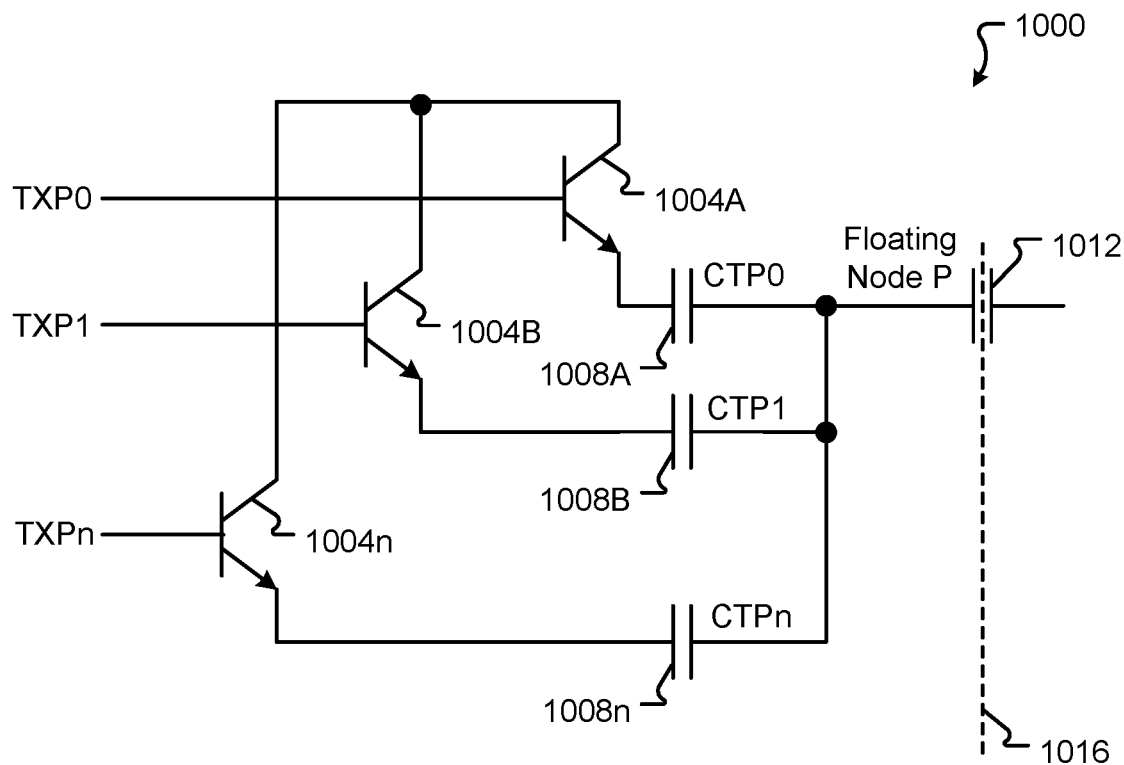
FIG. 10A shows an additional illustrative block diagram of a device or an isolation system.
Figure 10B:
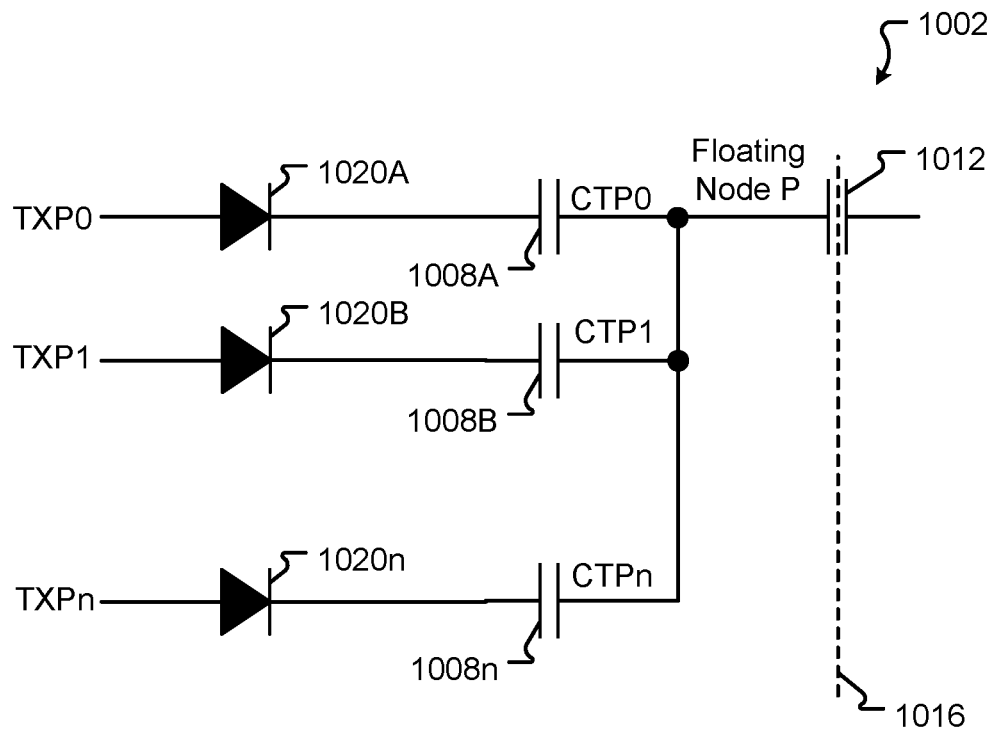
FIG. 10B shows an additional illustrative block diagram of a device or an isolation system.

FIG. 10A shows an additional illustrative block diagram 1000 of a device or an isolation system in accordance with examples as described herein, and FIG. 10B shows another additional illustrative block diagram 1002 of a device or an isolation system in accordance with examples as described herein. The block diagram 1000 and the block diagram 1002 may represent alternative embodiments for a structure used for driving galvanically isolated capacitors (e.g., different than the block diagram 700 as described with reference to FIG. 7) as described herein.

In some examples, driving capacitors directly with CMOS buffers may result in a lower signal swing at a floating node (e.g., floating node P) due to charge redistribution when each of the summing capacitors (CTP0, CTP 1, CTPn, etc.) are activated at each pulse. This problem can be reduced by driving the capacitors in a uni-directional way.

For example, as shown in the example of the block diagram 1000 of FIG. 10A, bipolar (or mosfet) devices 1004 (e.g., a first bipolar device 1004A, a second bipolar device 1004B, a third bipolar device 1004C, etc.) may be deployed in a follower configuration to drive an array of capacitors 1008 (e.g., including a first capacitor 1008A, a second capacitor 1008B, and a third capacitor 1008C) based on input signals from respective transmitter signal sources (e.g., TXP0, TXP1, TXPn, etc.). Additionally or alternatively, as shown in the example of the block diagram 1002 of FIG. 10B, one or more diodes 1020 (e.g., including a first diode 1020A, a second diode 1020B, a third diode 1020C, etc.) can be used to drive the array of capacitors 1008. The pulses sent across the array of capacitors 1008 may then pass through a capacitor 1012 that forms a galvanic isolation barrier 1016 as described herein (e.g., with a coupled capacitor not shown).

The result of using such devices (e.g., the bipolar devices 1004 and/or the diodes 1020) may reduce the capacitive loading effect of the capacitor 1012 (e.g., CPTn) once a driver reverse bias when the next edge is activated. This reduction of the capacitive loading effect may cause a reverse bias capacitance of the bipolar device(s) 1004 and/or the diode(s) 1020 to be in series with the capacitor 1012, and since this reverse bias diode can be much smaller than the capacitance of the capacitor 1012, the loading of the capacitor 1012 to the next transition is therefore reduced.

Figure 11:
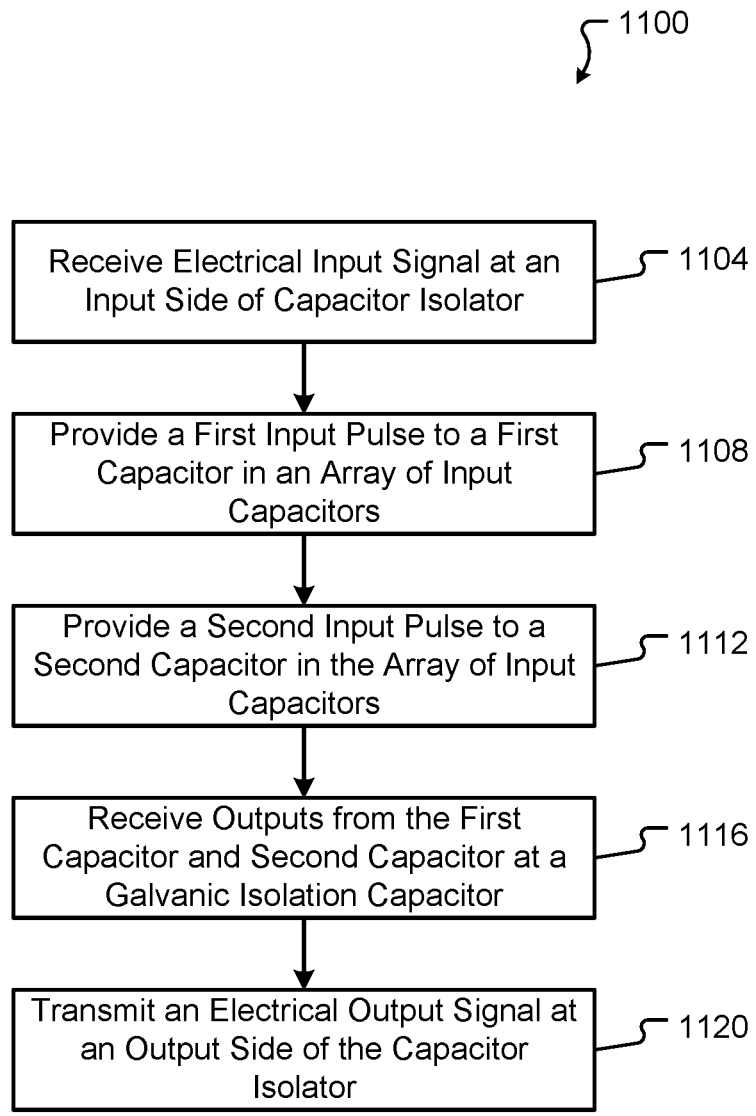
FIG. 11 shows a method for transmitting a signal across a galvanic isolation barrier with a capacitor isolator.

FIG. 11 shows a method 1100 for transmitting a signal across a galvanic isolation barrier with a capacitor isolator in accordance with examples as described herein. At step 1104, the method 1100 may include receiving an electrical input signal at an input side of the capacitor isolator.

At step 1108, the method 1100 may further include providing, as a result of receiving the electrical input signal, a first input pulse to a first capacitor in an array of input capacitors.

At step 1112, the method 1100 may further include providing, as a result of receiving the electrical input signal, a second input pulse to a second capacitor in the array of input capacitors, where the first capacitor and second capacitor are connected in parallel. Additionally, the second input pulse may be provided to the second capacitor with a delay as compared to when the first input pulse is provided to the first capacitor.

Additionally or alternatively, while not shown, the method 1100 may further include providing, as a result of receiving the electrical input signal, a third input pulse to a third capacitor in the array of input capacitors, where the third capacitor is connected in parallel with the first capacitor and the second capacitor. Additionally, the third input pulse may be provided to the third capacitor with the delay as compared to when the second input pulse is provided to the second capacitor.

In some examples, at least one of the first capacitor and the second capacitor may be driven with a buffer. For example, the buffer may be a CMOS buffer. Additionally, in some examples, the first capacitor may be driven by a first buffer, and the second capacitor may be driven by a second buffer. For example, if the capacitors are driven by separate buffers, the first buffer and the second buffer may be provided in a follower configuration. Additionally or alternatively, a diode may be connected to an input of the first capacitor.

At step 1116, the method 1100 may further include receiving outputs from the first capacitor and second capacitor at a galvanic isolation capacitor, where the outputs are received in response to the first capacitor and second capacitor receiving the first input pulse and second input pulse, respectively. In some examples, the galvanic isolation capacitor may establish the galvanic isolation barrier.

In some examples, the delay (e.g., with which the second input pulse is provided to the second capacitor compared to when the first input pulse is provided to the first capacitor) may substantially correspond to a rise time of a pulse applied to the galvanic isolation capacitor.

At step 1120, the method 1100 may further include transmitting an electrical output signal at an output side of the capacitor isolator, where the electrical output signal is generated based on the outputs received at the galvanic isolation capacitor from the first capacitor and the second capacitor. In some examples, the electrical output signal may be indicative of the electrical input signal. Additionally, the galvanic isolation capacitor may be connected to the first capacitor and the second capacitor at a floating node.

Steps 1104-1120 may not be performed sequentially, and some of the steps may be performed in parallel as understood by a person skilled in the art.

Different aspects, embodiments or implementations may, either individually and/or in combination, but need not, yield one or more of the following advantages. For example, as described herein, a device or isolation system is disclosed that modifies an input transmitting structure to extend a pulse duration for more efficient detection of corresponding pulses (e.g., to receive signaling) and to enable setting a threshold for detecting the pulses to a high value for good noise margin (e.g., so that the pulses and pulse detection are not as susceptible to noise).

Various embodiments are contemplated in addition to those disclosed herein. The described embodiments should be considered as examples rather than as limiting the scope of the claims. In addition to the foregoing embodiments, a review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

What is claimed is:

1. A capacitive isolator, comprising:
   an input side that receives an electrical input signal,
   wherein the input side comprises an array of input capacitors, wherein each capacitor in the array of input capacitors receives an input pulse based on the electrical input signal, wherein each capacitor in the array of input capacitors receives the input pulse offset from input pulses received at others of the capacitors in the array of input capacitors thereby extending a pulse duration of the electrical input signal, wherein the array of input capacitors comprises a first capacitor and a second capacitor connected in parallel with one another, wherein the first capacitor receives a first input pulse and wherein the second capacitor receives a second input pulse, wherein the second capacitor receives the second input pulse an amount of time after the first capacitor receives the first input pulse, wherein the second capacitor receives the second input pulse an amount of time after the first capacitor receives the first input pulse, and wherein the amount of time is substantially equal to a rise time of a pulse applied to a galvanic isolation capacitor;

an output side that outputs an electrical output signal, wherein the electrical output signal is indicative of the electrical input signal; and an isolation barrier that electrically isolates the input side from the output side.

2. The capacitor isolator of claim 1, wherein the galvanic isolation capacitor is connected to the array of input capacitors at a floating node.

3. The capacitor isolator of claim 2, wherein the pulse duration of the electrical input signal is substantially equivalent to a total sum of delay applied to between each of the input pulses.

4. The capacitor isolator of claim 1, wherein the array of input capacitors comprises a third capacitor connected in parallel with the first capacitor and the second capacitor.

5. The capacitor isolator of claim 4, wherein the third capacitor receives a third input pulse the amount of time after the second capacitor receives the second input pulse.

6. A method of transmitting a signal across a galvanic isolation barrier, the method comprising:

receiving an electrical input signal at an input side of the capacitor isolator;

providing, as a result of receiving the electrical input signal, a first input pulse to a first capacitor in an array of input capacitors;

providing, as a result of receiving the electrical input signal, a second input pulse to a second capacitor in the array of input capacitors, wherein the first capacitor and second capacitor are connected in parallel, wherein the second input pulse is provided to the second capacitor with a delay as compared to when the first input pulse is provided to the first capacitor, and wherein the delay is substantially equal to a rise time of a pulse applied to a galvanic isolation capacitor;

receiving outputs from the first capacitor and second capacitor at the galvanic isolation capacitor, wherein the outputs are received in response to the first capacitor and second capacitor receiving the first input pulse and second input pulse, respectively; and transmitting an electrical output signal at an output side of the capacitor isolator, wherein the electrical output signal is generated based on the outputs received at the galvanic isolation capacitor from the first capacitor and the second capacitor.

7. The method of claim 6, wherein the electrical output signal is indicative of the electrical input signal.

8. The method of claim 6, wherein the galvanic isolation capacitor establishes the galvanic isolation barrier.

9. The method of claim 6, wherein the galvanic isolation capacitor is connected to the first capacitor and the second capacitor at a floating node.

10. The method of claim 6, further comprising:

providing, as a result of receiving the electrical input signal, a third input pulse to a third capacitor in the array of input capacitors, wherein the third capacitor is connected in parallel with the first capacitor and the second capacitor, and wherein the third input pulse is provided to the third capacitor with the delay as compared to when the second input pulse is provided to the second capacitor.

11. The method of claim 6, further comprising:

driving at least one of the first capacitor and the second capacitor with a buffer.

12. The method of claim 11, wherein the buffer comprises a CMOS buffer.

13. The method of claim 6, wherein the first capacitor is driven by a first buffer and the second capacitor is driven by a second buffer and wherein the first buffer and the second buffer are provided in a follower configuration.

14. The method of claim 6, wherein a diode is connected to an input of the first capacitor.

15. An isolation system, comprising:

an input circuit;

an output circuit; and an isolation barrier that electrically isolates the input circuit from the output circuit, wherein the input circuit comprises an array of input capacitors, wherein each capacitor in the array of input capacitors receives an input pulse based on an electrical input signal received at the input circuit, wherein each capacitor in the array of input capacitors receives the input pulse offset from input pulses received at others of the capacitors in the array of input capacitors thereby extending a pulse duration of the electrical input signal, wherein the array of input capacitors comprises a first capacitor and a second capacitor connected in parallel with one another, wherein the first capacitor receives a first input pulse and wherein the second capacitor receives a second input pulse, wherein the second capacitor receives the second input pulse an amount of time after the first capacitor receives the first input pulse, wherein the second capacitor receives the second input pulse an amount of time after the first capacitor receives the first input pulse, and wherein the amount of time is substantially equal to a rise time of a pulse applied to a galvanic isolation capacitor that receives outputs from the first capacitor and second capacitor.

* * * * *